United States Patent [19]

Ecklund

[11] 4,392,254

[45] Jul. 5, 1983

[54] MECHANICAL TUNER WITH MICROPHONICS ELIMINATION CIRCUITRY

[75] Inventor: Lawrence M. Ecklund, Wheaton, Ill.

[73] Assignee: Motorola Inc., Schaumburg, Ill.

[21] Appl. No.: 191,970

[22] Filed: Sep. 29, 1980

[51] Int. Cl.³ .............................................. H04B 1/26
[52] U.S. Cl. .................................... 455/173; 455/182
[58] Field of Search ............................... 455/162-164, 455/170, 173, 182, 260, 160; 334/16; 358/195.1; 331/1 R, 9, 36 R

[56] References Cited

U.S. PATENT DOCUMENTS

| | | | |
|---|---|---|---|
| 2,977,466 | 3/1961 | Slater | 455/164 |
| 3,289,096 | 11/1966 | Longuemare, Jr. et al. | 331/1 R |
| 3,346,814 | 10/1967 | Haggai | 455/260 |
| 3,529,259 | 9/1970 | Holmes et al. | 331/9 |
| 3,657,654 | 4/1972 | Friberg | 455/195 |
| 3,727,139 | 4/1973 | Gallant et al. | 455/195 |

Primary Examiner—Marc E. Bookbinder
Attorney, Agent, or Firm—Phillip H. Melamed; James S. Pristelski; James W. Gillman

[57] ABSTRACT

A mechanical radio receiver tuner with microphonics elimination circuitry is disclosed. During a mechanical tuning mode, the mechanical position of a movable tuning element provides an associated adjustable reactance which determines a control voltage for controlling the output of a voltage controlled oscillator (VCO) that serves as the local oscillator for a superheterodyne radio receiver. After initially selecting a channel frequency by adjusting the output of the VCO with the mechanically movable tuning element in the tuning mode, a switch means disconnects the movable tuning element from operative control of the local oscillator frequency and implements a locked tuning mode by providing the VCO with a control voltage related to the difference between the frequency of the output signal of a mixer stage and the center frequency of a fixed tuned narrow passband IF stage that follows the mixer. Preferably, this control voltage for the locked tuning mode is provided by a phase locked loop. When substantial changes in the reactance provided by the movable tuning element are sensed, the switching circuit reimplements the tuning mode so that the position of the mechanically movable element will once again control the output of the local oscillator. In this manner, minor changes in the mechanical position of the movable tuning element during the locked tuning mode have no effect on receiver tuning and therefore microphonics are substantially eliminated.

12 Claims, 3 Drawing Figures

MECHANICAL TUNER WITH MICROPHONICS ELIMINATION CIRCUITRY

BACKGROUND OF THE INVENTION

The present invention is generally related to the field of mechanical receiver tuners, and is more specifically related to the field of mechanical tuners for tuning radio receivers.

Typically, in manual mechanically tunable radio receivers, mechanical vibrations of the receiver result in tuning "microphonics" which are generally defined as undesired tuning perturbations due to the mechanical vibrations causing undesired movement of mechanically movable tuning elements which determine the tuning of the radio receiver by determining the magnitude of associated impedances (reactances or resistances) in accordance with the mechanical position of the tuning elements. The elimination of such tuning microphonics has been a long standing problem in the mechanically tunable radio receiver art and most solutions involve providing shock protection for the mechanically movable elements or increasing the friction coefficient between the movable tuning elements and their surroundings. These solutions have generally proved to be unsatisfactory since they are either too costly or they undesirably increase the actuation force required to initially tune the radio to desired stations by desired movement of the mechanically movable tuning elements.

All electronic radio tuners have been implemented through the use of complex and costly frequency synthesizers. While these electronic tuners have substantially eliminated the microphonics problems of the prior mechanical tuners, they require a number of additional costly electronic circuits and are generally not as easily adjusted and convenient to set as the prior mechanical tuners.

SUMMARY OF THE INVENTION

An object of the present invention is to provide an improved mechanical receiver tuner which is adaptable with microphonics elimination circuitry for overcoming the above-mentioned disadvantages of the prior art mechanical tuners.

A more particular object of the present invention is to provide an improved mechanically adjustable receiver tuner which while being mechanically tunable does not suffer from tuning microphonics due to the effect of vibrations on the tuner.

In one embodiment of the present invention, a mechanical receiver tuner with microphonics elimination circuitry is provided. This mechanical receiver tuner comprises: tunable front end receiver means including local oscillator means for developing a local oscillator signal having a frequency which effectively selects a received signal frequency and rejects signals at frequencies substantially different from said received signal frequency; mechanical tuning means operative in a tuning mode for tuning said front end means to a desired signal frequency in accordance with the position of at least one mechanically movable tuning element which provides an associated tuning impedance in accordance with the position of said movable tuning element, said impedance controlling the local oscillator signal frequency; electronic tuning means operative in a locked tuning mode for maintaining said received front end means tuned to a received signal frequency by developing a control voltage and utilizing said control voltage to control the frequency of said local oscillator signal such that the tuning of the front end means tracks the received signal frequency; and switch means for implementing said tuning mode wherein said movable tuning element is utilized to initially select a desired received signal frequency and for subsequently implementing said locked tuning mode while terminating said tuning mode by then disconnecting said movable tuning element from control of said local oscillator signal frequency and effectively connecting said electronic tuning means to control the frequency of said local oscillator signal, whereby mechanical vibrations during the locked tuning mode which may move the position of the movable tuning element do not affect the local oscillator signal frequency and thereby affect the tuning of the mechanical receiver tuner.

Essentially, in the preferred embodiment, a manually adjustable movable mechanical tuning element is provided to tune a receiver during a "tuning mode" wherein the mechanical position of the tuning element determines a control voltage for a voltage controlled oscillator (VCO) with the frequency of the output signal of the voltage controlled oscillator determining the local oscillator signal frequency of the receiver which thereby determines the tuning of the receiver. When the switch means senses a lack of substantial movement of the tuning element and also senses that a mixer stage of the radio is producing a desired output signal at substantially a proper frequency, then the switching means alters the tuning circuitry to implement a "locked tuning mode" during which the movable tuning element is disconnected from its control of the frequency of the local oscillator signal and the electronic tuning means is connected such that its control voltage now controls the tuning of the radio receiver. Preferably, the electronic tuning means comprises circuitry for developing a control voltage related to the difference between a mixer stage output signal and the center frequency of a subsequent fixed tuned, narrow passband IF stage. This control voltage is readily obtained through the use of a phase locked loop which tracks the output signal provided by the mixer stage which has a frequency within the IF passband.

When the switch means senses a substantial movement of the position of the movable tuning element, the switch means recognizes this as not being due to microphonics, but being due to the intentional manual movement of this element and this results in reimplementing the tuning mode and terminating the locked tuning mode. These latter functions are accomplished by the reconnection of the movable tuning element to control the output frequency of the local oscillator and the effective disconnection of the electronic tuning means control voltage which no longer substantially determines the output frequency of the local oscillator signal. In the above manner, the present invention eliminates substantially all microphonics since minor movement of the mechanical tuning element during the locked tuning mode will have no effect upon altering the tuning of the radio receiver since the mechanical tuning element is not operatively connected to the tuning circuitry during the locked tuning mode. Thus the present invention combines the inexpensive and easily set qualities of a mechanical tuner with the substantially microphonicless operation to electronic tuning, and this is accomplished without the use of a complex and costly electronic frequency synthesizer.

In the preferred embodiment of the present invention, the electronic tuning means comprises an IF tracking phase locked loop which is utilized in the stereo demodulator of an AM stereo system. This is especially advantageous since most proposed AM stereo systems require the use of a phase locked loop which tracks the IF frequency. Alternatively, the control voltage for the electronic tuning means can be provided in an FM system by virtue of the DC output of an FM discriminator. In either case, pre-existing circuitry already incorporated in the radio receiver can be utilized to provide an electronic control voltage for the electronic tuning means of the present invention.

BRIEF DESCRIPTION OF THE DRAWINGS

For a more complete understanding of the present invention, reference should be made to the drawings, in which.

DESCRIPTION OF THE PREFERRED EMBODIMENTS

Figure 1:
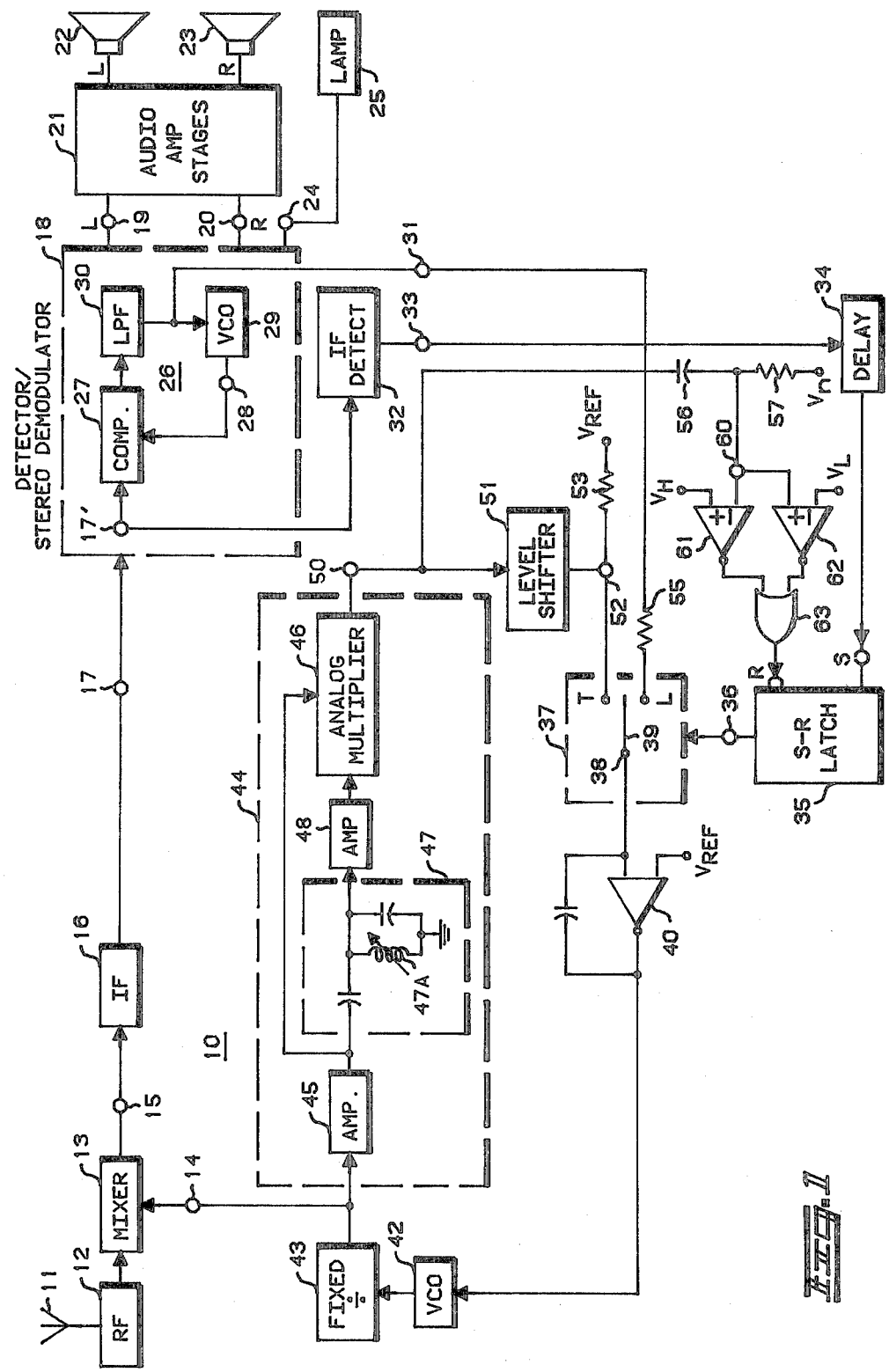
FIG. 1 is a block and schematic diagram of a mechanically tunable radio receiver containing microphonics elimination circuitry.

FIG. 1 illustrates an AM and/or FM stereo radio receiver 10 having a manual mechanical tuner with microphonics elimination circuitry. Essentially, the radio receiver 10 is tuned by a manually movable mechanical tuning element during an initial "tuning mode" of the receiver and subsequently a switch means is automatically activated to implement a "locked tuning mode" wherein an electronic tuning means develops a control voltage which locks the receiver 10 onto a received channel frequency while the mechanically movable tuning element is operatively disconnected so that the effect of microphonics on the mechanical tuning element will not alter the tuning of the receiver during the locked tuning mode.

The receiver 10 comprises an antenna 11 for receiving radiated modulated RF carrier signals and these signals are provided to an optional RF circuit stage 12 which amplifies the received RF signals and also provides some broadband selectivity for these signals. The output of the RF stage 12 is provided as an input to a mixer circuit 13 which also receives a local oscillator signal having a selectable frequency provided at a terminal 14 by a local oscillator circuit means which will subsequently be described. Essentially, the mixer 13 down converts the received RF signals from the RF stage 12 and provides difference frequencies at an output terminal 15 which serves as the input to a narrow passband IF stage 16 which has a center frequency fixed tuned to a predetermined frequency such as 455 KHz for AM reception or 10.7 MHz for FM reception. The output of the IF stage 16 is provided at an output terminal 17. Due to the narrow passband of the IF stage 16, only mixer output signals having frequencies substantially corresponding to the IF center frequency will be provided at the terminal 17 as IF output signals.

Essentially, the components 11 through 17 in combination with the later to be described local oscillator circuit form the basis of a superheterodyne radio receiver tuning section and the principle of operation of that tuning section is well known to those of skill in the art. The above-enumerated components basically form the tunable front end of the radio receiver 10 and result in the selection of one of the radiated carrier signals received by the antenna 11 wherein the frequency of this selected signal bears a predetermined arithmetic relationship between the center frequency of the IF stage 16 and the frequency of the local oscillator signal provided at the terminal 14. Thus the frequency of the local oscillator signal effectively selects an RF signal frequency and the mixer 13 and IF stage 16 effectively reject received RF signals at frequencies substantially different from the selected RF signal frequency.

The terminal 17 is provided as an input to a detector/stereo demodulator 18 shown dashed in FIG. 1. This element either comprises an FM discriminator and FM stereo demodulator or an AM detector and AM stereo demodulator. Basically the element 18 receives the IF output signal provided at the terminal 17 which is representative of a desired received RF carrier signal and the IF signal has modulation corresponding to the modulation of this received RF signal. The element 18 provides audio signals in response to the modulation of the IF output signal at the terminal 17 and also, if the carrier signal being received is a stereo signal, provides separate and different audio output signals at left and right audio output terminals 19 and 20, respectively. These terminals are coupled as inputs to audio amplifier stages 21 which provide amplified audio signals to left and right speakers 22 and 23, respectively. The combination detector/stereo demodulator 18 also provides an output at a terminal 24 which provides a drive signal for a stereo pilot signal indicator lamp 25. The operation of the above components, as described, is conventional and known to all radio engineers.

For FM systems, it is contemplated that the element 18 would comprise a standard FM discriminator circuit followed by conventional FM stereo demodulators such as Motorola, Inc. integrated circuits (IC's) MC1309 or MC1310 which can provide the desired outputs at the terminals 19, 20 and 24. For an AM stereo radio receiver, it is contemplated that the component 18 will comprise any of the known proposed AM stereo detector and demodulator circuits, and preferably would utilize one of these circuits having a phase locked loop 26 which comprises a phase/frequency comparator 27 that receives an input from an IF signal terminal 17' and also from an output terminal 28 of a voltage controlled oscillator (VCO) 29. The comparator 27 provides a difference output signal to a low pass filter (LPF) 30 which provides a filtered DC control voltage output at a terminal 31 which is coupled as a control input to the voltage controlled oscillator 29 and which is also utilized by the local oscillator means in a manner to be subsequently described. It is contemplated that the signal at the terminal 17' corresponds to the IF output signal present at the terminal 17.

It should be noted that in most proposed AM stereo demodulator systems a phase locked loop similar to the loop 26 is disclosed in which the loop tracks the IF signal output from the IF stage wherein this is necessary to obtain the phase of the IF output signal such that the proper demodulation of the AM stereo signal can be implemented to obtain proper stereo signal separation.

One such AM stereo demodulator system is shown in U.S. Pat. No. 4,128,586 assigned to the same assignee as the present invention. It should also be noted that an IF tracking phase locked loop like the loop 26 can be used in an FM system to provide the signal at the terminal 31 which will be subsequently utilized by the local oscillator means. In each case the phase locked loop will track the output signal of the mixer stage 13 having a frequency which is closest to the center frequency of the IF stage 16. Alternatively, the variable DC output of an FM discriminator can provide the signal at the terminal 31 which is related to the difference between the frequency of the mixer output signal closest to the IF center frequency and the IF center frequency.

Regardless of whether an AM or FM radio receiver is involved, the present invention contemplates the use of an IF detection circuit 32 which receives the IF output signal from the IF stage 16 and provides a detection signal at an output terminal 33 in response to a sufficiently large IF signal magnitude being provided as the output of the stage 16. The terminal 33 is coupled as an input to a delay circuit 34, which can comprise an integrator followed by a threshold comparator circuit, that supplies an output signal to a set terminal S of a set-reset (S-R) latch circuit 35. The latch 35 provides an output signal to a control terminal 36 of an electronic switch 37 shown dashed. The switch 37 effectively comprises a wiper arm terminal 38 and a wiper arm 39 which is positioned in either of two set positions. In the first of these positions the terminal 38 is directly coupled to a terminal T of the switch 37 and this represents the tuning mode position for the switch 37 wherein this is implemented in response to the resetting of the latch 35. In the second position of the wiper arm 39, the terminal 38 is directly connected to a terminal L of the switch 37 and this represents the locked tuning mode position of the switch 37 that is produced in response to the setting of the latch 35. The setting and resetting of the latch 35 are contemplated as being represented by high and low logic state signals, respectively, at the terminal 36. Electronically controllable switches such as the switch 37 are readily implemented by conventional circuits such as logic circuits and/or diodes, and other configurations other than the above-described two pole switch for the switch 37 can be utilized.

The terminal 38 is directly connected as an input to a high gain DC amplifier which is illustrated as comprising an operational amplifier 40 having one input directly coupled to a reference voltage VREF and another input directly connected to the terminal 38, and having the output of the amplifier 40 capacitively coupled to the terminal 38. This configuration implements a high gain DC amplifier. The output of this DC amplifier is provided as a control voltage input to a voltage controlled oscillator 42 that supplies an output signal whose frequency is determined by this control voltage. The output signal of the VCO 42 is supplied as an input to a fixed frequency divider 43 whose output is supplied as the local oscillator output signal at the terminal 14. The fixed divider 43 provides isolation between the VCO 42 and the local oscillator terminal 14. The output of the fixed divider 43 is also supplied as an input to an effective frequency discriminator 44 shown dashed in FIG. 1.

The discriminator 44 comprises a buffer amplifier 45 which receives its input from the terminal 14 and provides as its output a signal that is directly coupled as one input to an analog multiplier 46. The output of the amplifier 45 is also supplied to a manually and mechanically adjustable resonant circuit 47 shown dashed in FIG. 1. The resonant circuit 47 comprises various fixed and variable tuning elements with at least one variable tuning element 47A corresponding to a movable mechanical tuning element which provides an associated reactance in accordance with the mechanical positions of this tuning element. The circuit 47 as illustrated in FIG. 1 comprises at least one variable inductor and two fixed capacitors, but of course it will be understood that variable capacitance tuning and fixed inductors could be utilized instead. In addition, other mechanically adjustable tuning circuits could be used rather than the variable reactance circuit 47. These could comprise mechanically adjustable resistive tuning circuits which develop tuning control voltages in response to the mechanical position of variable resistive tuning elements. These circuits also can be described as variable mechanical impedance tuning circuits. In each case the end result is to provide a mechanically adjustable tuning control voltage at an output terminal which controls the output frequency of the VCO 42 during the tuning mode.

Figure 2:
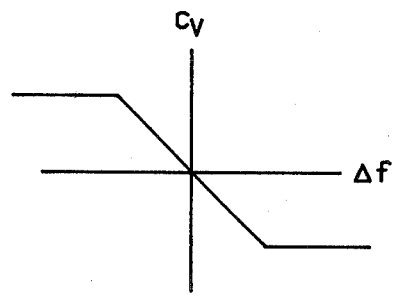
FIG. 2 is a graph illustrating the magnitude of a frequency control voltage provided by the circuitry in FIG. 1 as a function of the mistuning between the receiver front end and a desired received signal.

The output from the amplifier 45 is coupled through the mechanically tunable resonant circuit 47 and provides an input signal to a high gain limited output amplifier 48 (such as RCA device CA-3028) which has its output directly coupled as an input to the analog multiplier 46. It is contemplated that the element 46 corresponds to a Motorola, Inc. integrated circuit MC1596 which is connected in such a way so as to provide phase detection for determining the phase difference between the input signals provided from the amplifier 48 and provided directly from the output of the amplifier 45. Essentially, the analog multiplier 46 provides a frequency discriminator function for the local oscillator output signal provided at the terminal 14 wherein the multiplier 46 provides at an output terminal 50 a DC control signal $C_v$ which varies in accordance with the difference between the frequency of the local oscillator signal produced at the terminal 14 and the resonant frequency of the tuned circuit 47. FIG. 2 illustrates a plot of the magnitude of the control signal $C_v$ as a function of this frequency difference wherein zero output, as shown in FIG. 2 of the analog multiplier 46 is provided when the frequency of the local oscillator output signal at the terminal 14 is identical to the resonant frequency of the circuit 47.

Figure 3:
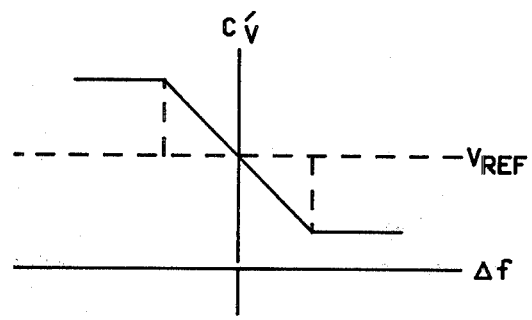
FIG. 3 is a graph illustrating the characteristic shown in FIG. 2 which has been subjected to a predetermined level shift.

The terminal 50 is connected as an input to a level shifter 51 which provides a modified control voltage $C'_v$ at an output terminal 52 which is connected through a resistor 53 to a terminal held at the reference potential VREF. FIG. 3 illustrates the magnitude of the control voltage $C'_v$ as a function of frequency difference wherein it is clear that the graph of FIG. 3 represents the characteristic in FIG. 2 merely shifted by an amount such that the characteristic is centered about the reference voltage VREF. The terminal 52 is directly connected to the terminal T of the electronic switch 37, whereas the terminal L of this switch is coupled through a resistor 55 to the terminal 31 which is representative of the variable DC control voltage produced by the low pass filter 30 and represents the frequency difference between the IF signal produced at the terminal 17 (17') and the fixed center frequency of the IF passband for the IF stage 16.

The operation of the stereo radio receiver 10 will now be explained in detail for each of its two tuning modes of operation which correspond to the "tuning mode" and the "locked tuning mode". Subsequently, the operation of additional circuitry and the operation of the set-reset latch 35 will be discussed with respect to how these elements control the electronic switch 37 to implement changes between these two modes of operation.

In the tuning mode of operation for the receiver 10, the terminal 38 is directly connected to the terminal T. This results in the shifted control voltage $C'_\nu$ at the terminal 52 providing the input to the high gain DC amplifier 40 which provides the control voltage for the voltage controlled oscillator 42 that determines the frequency of the local oscillator output signal provided at the terminal 14. According to standard superheterodyne tuning principles, the frequency of the local oscillator signals at the terminal 14 will determine the tuning of the front end of the radio receiver 10 through the interaction of the mixer 13 and the fixed tuned narrow band IF stage 16. The manually movable mechanical tuning elements in the circuit 47 adjust the frequency of the local oscillator signals at the terminal 14 by altering the magnitude of the DC control voltage $C_\nu$ at the terminal 50 in accordance with the frequency difference between the resonant frequency of the circuit 47 and the frequency output of the voltage controlled oscillator 42 as divided down by the fixed divider 43. Thus, in essence, the elements within the block 44 form a frequency discriminator wherein a DC output is provided at the terminal 50 related to the frequency difference between the local oscillator output signals at the terminal 14 and the resonance of a mechanically adjustable resonant circuit 47 which is manually adjustable. In order to tune the radio receiver 10 during this tuning mode, it is necessary to manually adjust the movable tuning elements in the circuit 47 so as to provide a different DC output voltage at the terminal 50 which by virtue of the level shifter 51, the switch 37 and the amplifier 40 adjusts the input control voltage to the voltage controlled oscillator 42 to thereby alter the frequency of the local oscillator output signals provided at the terminal 14.

It is contemplated that substantial manual movement of the movable tuning element in the resonant circuit 47 will be sensed and automatically implement the tuning mode by causing the switch 37 to connect the terminals 38 and T. In the absence of intentional substantial movement of the movable tuning element in the resonant circuit 47, and in response to the detection of an IF signal by the IF detector circuit 32, it is contemplated that the switch 37 will be positioned such that the terminals 38 and L will be directly connected thus disconnecting the operative control connection between the mechanically movable tuning element in the tuning circuit 47 and the control input to the voltage controlled oscillator 42. During the locked tuning mode, which is characterized by the direct connection of the terminals 38 and L, the phase locked loop 26, by virtue of the output voltage at terminal 31 of the low pass filter 30, will provide a DC control signal at the terminal L which will effectively lock up the frequency output of the voltage controlled oscillator 42 such that the front end of the receiver 10 will track a received RF signal by altering the frequency of the VCO 42 so that the phase locked loop 26 will continue to track the corresponding IF signal provided in response to this received RF signal. In this manner, the tuning of the front end of the radio receiver 10 will be maintained, and this will occur despite any effect of microphonics on the position of the movable tuning element in the resonant tuned circuit 47. Thus clearly the present invention has provided a mechanically tunable radio receiver in which the effect of microphonics has been totally eliminated during the locked tuning mode since the mechanically movable tuning element has been disconnected from operative control of the local oscillator frequency during the locked tuning mode.

While the above description of each of the tuning and locked tuning modes is sufficient to enable persons of average skill in the art to comprehend the operation of the receiver 10, the manner in which the switch 37 is controlled has not yet been fully discussed and this subject will now be discussed in detail. In response to the IF detector circuit 32 determining the presence of a sufficiently large magnitude IF signal, a detection output signal is provided at the terminal 33. This results, after an appropriate delay provided by the delay circuit 34 which allows the phase locked loop 26 to become locked, in providing a high logic signal at the terminal S which will set the latch 35 so as to force the electronic switch 37 to implement the locked tuning mode by connecting the terminals 38 and L. It is contemplated that this setting of the latch 35 will only occur after a sufficient time has elapsed indicating that desired mechanical movement of the movable tuning element in the circuit 47 has ceased. This of course would correspond to the continuous reception of a desired RF signal that resulted in the production of a corresponding IF signal which was continuously detected by the circuit 32. Thus, the delay circuit 34 could merely comprise a capacitive delay circuit having a slow charge and rapid discharge characteristic followed by a threshold comparator. The above-described operation illustrates how the receiver 10 is automatically switched to the locked tuning mode when a received RF signal results in the continuous production of an IF output signal at terminal 17 that in turn provides a continuous input for the IF detector 32. Alternatively, a stereo pilot detection can be utilized to implement the locked tuning mode and this could be accomplished by directly connecting terminals 24 and 33 and disconnecting the IF detector 32. In this situation, the locked tuning mode is only implemented for stereo reception.

In order to reset the latch 35 to implement the tuning mode whenever it is desired to intentionally move the movable tuning element of the circuit 47 to tune the radio, it is necessary to provide a resetting voltage at a reset terminal R of the latch 35. This is accomplished in the following manner. The frequency discriminator output at the terminal 50 is coupled as an input across the series connection of a capacitor 56 to an input terminal 60 which is provided as an input to a low input terminal of a first DC comparator 61 and as an input to a high input terminal of a second DC comparator 62. The comparator 61 receives a high reference voltage at a terminal $V_H$ and the comparator 62 receives a low reference voltage at a terminal $V_L$. The terminal 60 is coupled through a resistor 57 to a terminal $V_M$ which is held at a reference voltage between the voltages at the terminals $V_H$ and $V_L$. It is contemplated that both of the comparators 61 and 62 provide low voltage outputs except if the voltage at the terminal 60 either exceeds the high reference voltage at terminal $V_H$ or goes below the low reference voltage at terminal $V_L$ at which time one of the comparators will provide a high voltage output. The outputs of the comparators 61 and 62 are coupled as inputs to an OR gate 63 which has its output directly coupled to the reset terminal R of the latch 35.

In essence, the comparators 61 and 62 and the OR gate 63 form an amplitude window for the voltage at the terminal 60, and this voltage, due to the capacitive coupling of the terminal 60 to the terminal 50 is a transient voltage representative of the change in the output of the analog multiplier 46 wherein this change would be due to the movement of the movable tuning element of the resonant circuit 47. In this manner, for substantial intentional movement of tuning elements in the resonant circuit 47, the voltage at the terminal 60 will exceed or be below the reference voltages supplied to the comparators 61 and 62 resulting in the resetting of the latch 35 thereby forcing the switch 37 to implement the tuning mode of operation for the receiver 10. Thus the movement of tuning elements in the resonant circuit 47 will automatically force the receiver 10 into its tuning mode, whereas when the tuning movement of the movable elements in the circuit 47 ceases, the IF detector 32 and delay circuit 34 result in setting the latch 35 to implement the locked tuning mode, assuming that a desired RF signal is being received which results in the production of a mixer output signal at the terminal 15 which is substantially at the center frequency of the IF stage 16.

It should be noted that the present invention contemplates distinguishing between microphonic variations in the movable tuning elements of the resonant circuit 47 and desired intentional variations in the movable tuning elements through the use of the series capacitive coupling to the terminal 60 and the use of the window reference voltages $V_H$ and $V_L$ which are intended to implement resetting of the latch 35 only in response to large excursions of the signal at the terminal 60 which would correspond to a substantial change in the reactance provided by the movable tuning element in the circuit 47 as opposed to minor changes in the reactance of this element due to typical radio receiver vibrations or temperature variations. It should also be noted that while the preceding sentence referred to the microphonic vibrations as being minor, the effect of these minor vibrations on the tuning of standard radio receivers is often times objectionable and has been found to seriously impair the performance of radio receivers wherein exact tuning of the receiver is necessary in order to prevent the destruction of side band information, this situation commonly existing for AM stereo systems.

While I have shown and described specific embodiments of this invention, further modifications and improvements will occur to those skilled in the art. One such modification would be to utilize the present invention in an FM stereo system wherein the voltage at the terminal 31 is provided by the variable DC voltage provided by the FM discriminator which receives the IF output signal at the terminal 17 and provides AC signals related to the IF output signal modulation and a variable DC signal related to the difference between the frequency of the IF output signal and the center frequency of the IF stage 16. All such modifications which retain the basic underlying principles disclosed and claimed herein are within the scope of this invention.

I claim:

1. A mechanical receiver tuner with microphonics elimination circuitry, comprising:

tunable front end receiver means including local oscillator means for developing a local oscillator signal having a frequency which effectively selects a received signal frequency and rejects signals at frequencies substantially different from said received signal frequency;

mechanical tuning means operative in a tuning mode for tuning said front end means to a desired signal frequency in accordance with the position of at least one mechanically movable tuning element which provides an associated variable tuning impedance having a magnitude determined in accordance with the position of said movable tuning element, the local oscillator signal frequency being determined by and corresponding to the magnitude of said tuning impedance;

electronic tuning means operative in a locked tuning mode for maintaining said receiver front end means tuned to a received signal frequency by developing a control voltage and utilizing said control voltage to control the frequency of said local oscillator means such that the tuning of said front end means tracks the received signal frequency; and switch means for implementing said tuning mode and utilizing said movable tuning element to provide a desired magnitude of said associated variable tuning impedance for initially selecting a desired received signal frequency, and for implementing said locked tuning mode while terminating said tuning mode by subsequently disconnecting said movable tuning element and said associated variable tuning impedance from control of said local oscillator signal frequency and effectively connecting said electronic tuning means to substantially control the frequency of said local oscillator signal, whereby mechanical vibrations during the locked tuning mode which move the position of the movable tuning element and thereby alter the magnitude of said associated variable impedance do not affect the local oscillator signal frequency.

2. A mechanical receiver tuner according to claim 1 wherein said tunable front end means includes a mixer stage for receiving RF signals and said local oscillator signal, said mixer stage providing an arithmetic combination output signal as an input to a fixed tuned narrow passband IF stage subsequent to the mixer stage wherein the mixer stage, the IF stage and the local oscillator means tune the front end receiver means according to superheterodyne tuning principles.

3. A mechanical receiver tuner according to claim 2 wherein said control voltage of said electronic tuning means is related to the difference between the frequency of the output signal of the mixer stage and the center frequency of the subsequent fixed tuned IF stage.

4. A mechanical receiver tuner according to claim 3 wherein said electronic tuning means comprises a phase locked loop which tracks the output signal of the mixer stage having a frequency which is closest to the center frequency of the IF stage.

5. A mechanical receiver tuner according to claim 3 wherein said electronic tuning means comprises an FM discriminator which provides a DC voltage related to the difference between the frequency of the mixer output signal closest to the center frequency of the IF stage and the center frequency of the IF stage.

6. A mechanical receiver tuner according to claim 1 wherein said local oscillator means comprises a voltage controlled oscillator which effectively receives control voltage signal inputs from different tuning circuits in accordance with whether said tuning mode or said locked tuning mode is being implemented, and wherein during said tuning mode said tuning impedance associated with said mechanically movable tuning element determines said control voltage signal input which is applied to said voltage controlled oscillator, while during said locked tuning mode said electronic tuning means, rather than said tuning impedance, substantially determines said control voltage signal input.

7. A mechanical receiver tuner according to claim 6 wherein said mechanical tuning means includes circuitry for providing a variable DC control voltage in accordance with the mechanical position of a movable tuning element, said variable voltage determining the control voltage input to the voltage controlled oscillator during said tuning mode.

8. A mechanical receiver tuner according to claim 7 wherein said tunable front end means includes a mixer stage for receiving RF signals and said local oscillator signal, said mixer stage providing an arithmetic combination output signal as an input to a fixed tuned narrow passband IF stage subsequent to the mixer stage wherein the mixer stage, the IF stage and local oscillator means tune the front end receiver means according to superheterodyne tuning principles, and wherein the control voltage provided to said voltage controlled oscillator by said electronic tuning means during said locked tuning mode is related to the difference between the frequency of the mixer output signal closest in frequency to the IF center passband frequency and the IF center passband frequency.

9. A mechanical receiver tuner according to any of claims 1, 4, 5, 6 or 7 wherein said switch means includes means for effectively terminating said locked tuning mode and implementing said tuning mode in response to sensing substantial movement of said movable tuning element.

10. A mechanical receiver tuner according to claim 9 which includes means for providing a switch control voltage related to the amount of change in the position of said movable tuning element, and wherein said switch means terminates said locked tuning mode and implements said tuning mode in response to sensing predetermined magnitude changes in said switch control voltage.

11. A mechanical receiver tuner according to claim 10 wherein said switch means implements said locked tuning mode in response to sensing a lack of change of said switch control voltage in addition to sensing the detection of a signal related to the selected received signal frequency.

12. A mechanical receiver tuner according to any of claims 1, 6 or 7 wherein said associated tuning impedance comprises an associated tuning reactance.

* * * * *

UNITED STATES PATENT AND TRADEMARK OFFICE
CERTIFICATE OF CORRECTION

PATENT NO. : 4,392,254
DATED : July 5, 1983
INVENTOR(S) : LAWRENCE M. ECKLUND

It is certified that error appears in the above—identified patent and that said Letters Patent is hereby corrected as shown below:

In column 10, line 27, insert --operatively--, after the word "subsequently".

Signed and Sealed this

Seventh Day of August 1984

[SEAL]

Attest:

GERALD J. MOSSINGHOFF

Attesting Officer    Commissioner of Patents and Trademarks